United States Patent
Rombach et al.

(10) Patent No.: US 7,800,975 B2
(45) Date of Patent: Sep. 21, 2010

(54) DIGITAL DATA BUFFER WITH PHASE ALIGNER

(75) Inventors: Gerd Rombach, Freising (DE); Soritios Tambouris, Munich (DE)

(73) Assignee: Texas Instruments Deutschland GmbH, Freising (DE)

( * ) Notice: Subject to any disclaimer, the term of this patent is extended or adjusted under 35 U.S.C. 154(b) by 447 days.

(21) Appl. No.: 12/028,637

(22) Filed: Feb. 8, 2008

(65) Prior Publication Data

US 2008/0215805 A1 Sep. 4, 2008

(30) Foreign Application Priority Data

Feb. 8, 2007 (DE) .................. 10 2007 006 374

(51) Int. Cl.
*G11C 8/18* (2006.01)

(52) U.S. Cl. .............. 365/233.12; 365/233.1; 713/400

(58) Field of Classification Search ............ 365/233.12, 365/233.1; 710/3, 52, 58; 711/110, E12.002; 713/400, 410, 500

See application file for complete search history.

(56) References Cited

U.S. PATENT DOCUMENTS

| | | |
|---|---|---|
| 5,952,857 A | 9/1999 | Suzuki |
| 2002/0067787 A1 | 6/2002 | Naven et al. |
| 2002/0114195 A1 | 8/2002 | Ahn et al. |
| 2003/0189503 A1 | 10/2003 | Kim et al. |
| 2003/0221044 A1 | 11/2003 | Nishio et al. |

*Primary Examiner*—Tuan T Nguyen
*Assistant Examiner*—R Lance Reidlinger
(74) *Attorney, Agent, or Firm*—John J. Patti; Wade J. Brady, III; Frederick J. Telecky, Jr.

(57) ABSTRACT

A digital data buffer has at least one data path and a parallel reference data path. The data path includes a first and second data register, and the reference path includes a third data register. A learn cycle control signal is applied to a multiplexer for selecting between the data path and the reference data path and is also applied in parallel to control circuitry of a phase aligner. The learn cycle control signal is for adjusting the phase of a clock signal at a second clock output of a phase locked loop so as to optimize setup and/or hold timing at the data input of the second data register.

7 Claims, 2 Drawing Sheets

DIGITAL DATA BUFFER WITH PHASE ALIGNER

This application claims priority from German Patent Application No. 10 2007 006 374.3, filed Feb. 8, 2007.

FIELD OF THE INVENTION

The invention relates to a digital data buffer having a data path or a plurality of parallel data paths, each with a data input for receiving a digital data input signal, a clock input for receiving a clock input signal, and a data output providing a digital data output signal for application to a data destination device. While the data destination device could be any device that requires a digital data input with an associated clock signal optimised in the setup/hold timing relationship and substantially free from phase jitter, a preferred application is the use in a memory system operating at clock frequencies as high as 800 MHz and above.

BACKGROUND

In a recent unpublished German patent application, a two flip-flop pipeline structure for a data buffer is proposed. The input data, which may actually be address data in a memory system, are clocked into the first flip-flop (more generally a "data register") with the system input clock, and from the output of the second flip-flop are clocked into the second flip-flop with an internal clock signal provided by a phase locked loop (PLL), the reference input of which receives the system input clock. The PLL also provides internal clock signals to data destination devices, e.g., RAM modules in a memory system. With such a two flip-flop pipeline structure, the propagation delay time (tpd) from the system clock input to the clock outputs is controlled by the PLL. Unless the PLL includes some phase adjustment means, the propagation delay time will be fixed and determined by the clock frequency. For the proper functionality of the structure, the phase of the internal clock at the second flip-flop must be adjusted so that even under the worst case conditions no violation of the setup/hold timing occurs, thus avoiding that the wrong data are stored in the second flip-flop. In view of this requirement, it would be safe to move the phase of the internal clock at the second flip-flop sufficiently away from the phase of the clock at the first flip-flop so as to cover the worst case condition. But this would also produce the longest propagation delay time.

SUMMARY

In one aspect, the invention provides a data buffer with a mechanism to optimize the setup/hold timing at the second flip-flop (or data register), so as to reduce the propagation delay time.

In described implementations, the invention provides a digital data buffer having a data path or a plurality of parallel data paths each with a data input for receiving a digital data input signal, a clock input for receiving a clock input signal and a data output providing a digital data output signal for application to a data destination device, e.g., a RAM module in a memory system. The data buffer further has a clock output for providing an output clock signal to the data destination device and a phase locked loop (PLL) with a phase aligner, a clock input, a feedback input, a feedback output and a plurality of clock outputs. The data path has a first data register with a data input, a clock input and a data output. The data path also has a second data register with a data input, a clock input and a data output. The data input of the first data register is selectively coupled to the data input of the buffer or to a reference data input through a multiplexer. The data output of the first data register is coupled to the data input of the second data register. The data output of the buffer is coupled to the data output of the second data register. The clock input of the buffer is coupled to the clock input of the first data register. The clock input of the buffer is coupled to the clock input of the phase locked loop (PLL). A first clock output of the phase locked loop (PLL) provides a feedback clock signal for application to the feedback input of the phase locked loop. A reference data path is provided in parallel with the data path including a third data register with a data input to which the reference data input is coupled and a reference data output. A second clock output of the phase locked loop provides a clock signal shifted in phase by the phase aligner with respect to the feedback clock signal for application to the clock input of the second data register and to the clock input of the third data register. The data output of the second data register and the reference data output of the third data register are applied to inputs of a logic circuit that has a control output. The phase aligner in the phase locked loop has associated control circuitry with a control input coupled to the control output of the logic circuit. A learn cycle control signal is applied in parallel to the multiplexer and to the control circuitry of the phase aligner causing the phase aligner in a learn cycle to adjust the phase of the clock signal at the second clock output of the phase locked loop so as to optimise the setup/hold timing at the data input of the second data register.

In a described implementation, the reference data path has the shortest possible propagation delay. The parallel data path is initially considered the "worst case delay path." Whenever deemed appropriate, and especially at power-up of the system, a learning session is performed. In such a learning session, identical data signals are sent in parallel over both of the data path and the reference data path. If the phase of the internal clock signal at the second data register is properly selected, identical signals occur at the outputs of the second and third data registers. If the signals are different, the phase aligner in the PLL is instructed to adjust the phase, e.g., by adding a phase step. By repeatedly adding or removing phase steps, a phase range where the signals are identical can be determined. Depending on whether data integrity or speed is the criterion, the phase of the PLL clock output will be set within the limits of the thus determined phase range. Typically, process variations, varying supply voltage or temperature or other operating conditions of the device having the inventive mechanism are compensated when a learn cycle is completed. Preferably, an edge of the output clock will then be positioned in the center of eye of the data output. The signal path of the output clock is preferably matched with the signal path of the data output.

It should be clear that practical implementations of the inventive data buffer may be integrated CMOS circuits. Depending on the particular process conditions, an actual circuit may be more or less performing. With the inventive concept, it is possible to screen actual hardware products according to performance in terms of propagation delay time (pdt) by testing the products for minimum pdf under safe setup/hold conditions.

According to another aspect of the invention, a memory system is provided that comprises a memory controller and at least one memory board which, in turn, comprises a digital data buffer as just disclosed. A described memory system includes a plurality of RAM modules. Digital address and clock signals from the memory controller are applied to each branch of the digital data buffer as digital data input signal and clock input signal and the data output signals and clock output signals from the digital data buffer are applied in parallel to the RAM devices

BRIEF DESCRIPTION OF THE DRAWINGS

The new architecture and the benefits of the inventive digital data buffer will be apparent from the below description of embodiments, with reference to the accompanying drawings, wherein.

DETAILED DESCRIPTION OF EXAMPLE EMBODIMENTS

Figure 1:
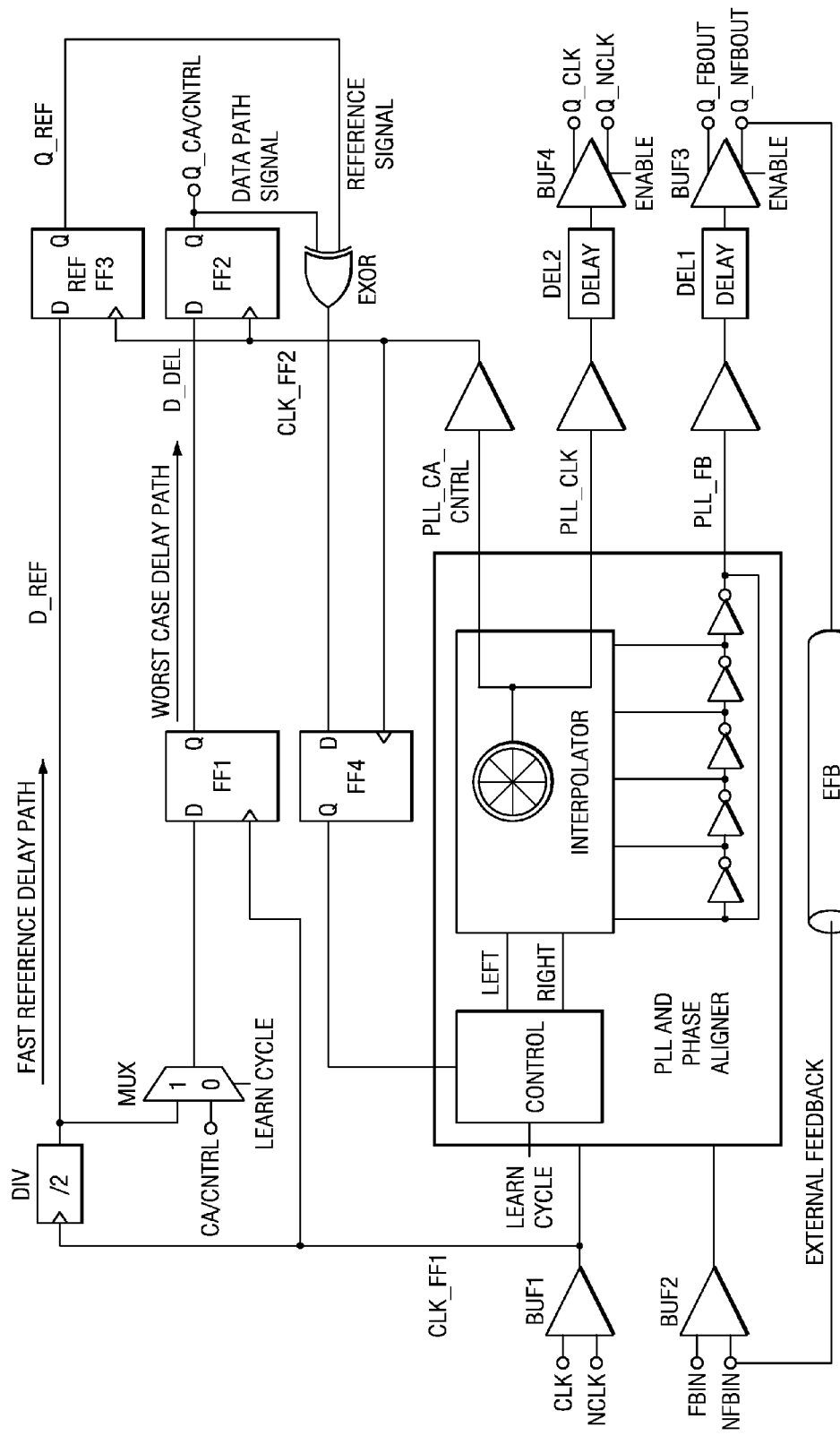
FIG. 1 is a schematic block diagram of a registered digital data buffer.

FIG. 1 shows the basic architecture of a data buffer according to the principles of the invention, in the form of a two flip-flop pipeline structure having a data path and a reference data path in parallel. In this context, a flip-flop is a particular type of data register, as is well known.

The data path comprises a first flip-flop FF1 in series with a second flip-flop FF2. The data input D of flip-flop FF1 is connected to the output of a multiplexer MUX, a first input of which receives a data input signal CA/CNTRL and a second input of which receives the output of a frequency divider DIV that divides a clock input signal CLK_FF1 by 2, which is also applied to the clock input of flip-flop FF1. Flip-flop FF2 has its D input connected to the Q output of flip-flop FF1, its Q output connected to a buffer data output Q_CA/CNTRL and its clock input connected to a clock output PLL_CA/CNTRL of a phase locked loop circuit PLL with an internal phase aligner. Since the latter clock output is that applied to flip-flop FF2, it is also identified as CLK_FF2 in FIG. 1.

The reference data path includes a third flip-flop FF3, the data input of which is also connected to the output of frequency divider DIV and the clock input of which also receives the clock output PLL_CA/CNTRL from the phase locked loop circuit PLL.

The outputs of both the second flip-flop FF2 and the third flip-flop FF3 are connected to inputs of an XOR gate EXOR, the output of which is connected to the data input D of a fourth flip-flop FF4, the clock input of which also receives the clock output PLL_CA/CNTRL from the phase locked loop circuit PLL.

In the embodiment shown in FIG. 1, the input clock signal CLK_FF1 is single-ended and obtained from differential clock input signals CLK and NCLK with clock buffer BUF1. This is a first input signal to the PLL (with phase aligner). A second input to the PLL is a feedback signal which, in this case, is a single-ended signal obtained with a buffer BUF2 from differential feedback input signals FBin and NFBin. These feedback signals are derived from a direct feedback output PLL_FB of the PLL with an output buffer BUF3, converting the PLL feedback output signal PLL_FB, delayed by delay element DEL1, to differential feedback output signals Q_FBout and Q_NFBout. These are applied to the inputs of input buffer BUF2 through an external feedback path EFB. By "external feedback path", it is intended to define a signal path outside of the chip on which the buffer structure is implemented. (For simplicity, only one of the routing paths is shown in FIG. 1, the two paths being similar.)

The PLL also has a further clock output, PLL_CLK, for application to data destination devices such as memory modules, through a delay element DEL2 and an output buffer BUF4 that provides differential outputs Q_CLK and Q_NCLK.

The PLL includes a ring oscillator with phase taps between successive inverter stages, five being shown in the example of FIG. 1. The phase taps of the ring oscillator are inputs to a phase interpolator. The phase interpolator has control inputs "left" and "right" and an output which provides the identical clock outputs PLL_CA/CNTRL and PLL_CLK. The control inputs "left" and "right" to the phase interpolator come from control circuitry inside of the PLL and phase aligner block.

In a normal operating mode, a control signal "Learn Cycle" applied to multiplexer MUX is inactive, and the multiplexer switches the data input signal CA/CNTRL to the data input of FF1. Also, the same inactive control signal is applied to the control circuitry within the PLL, so that the phase of the output signals PLL_CLK and PLL_CA/CNTRL is not changed by the phase aligner within the PLL.

In a "Learn" mode, the control signal "Learn Cycle" applied to multiplexer MUX is active, and the multiplexer switches the divided input clock signal CLK_FF1 to the data input of FF1. Also, since the same active "Learn Cycle" signal is applied to the control circuitry within the PLL, the system will now seek to adjust the phases of the clock outputs of the PLL so as to cope with the goals imposed, which are speed and data integrity.

Figure 2:
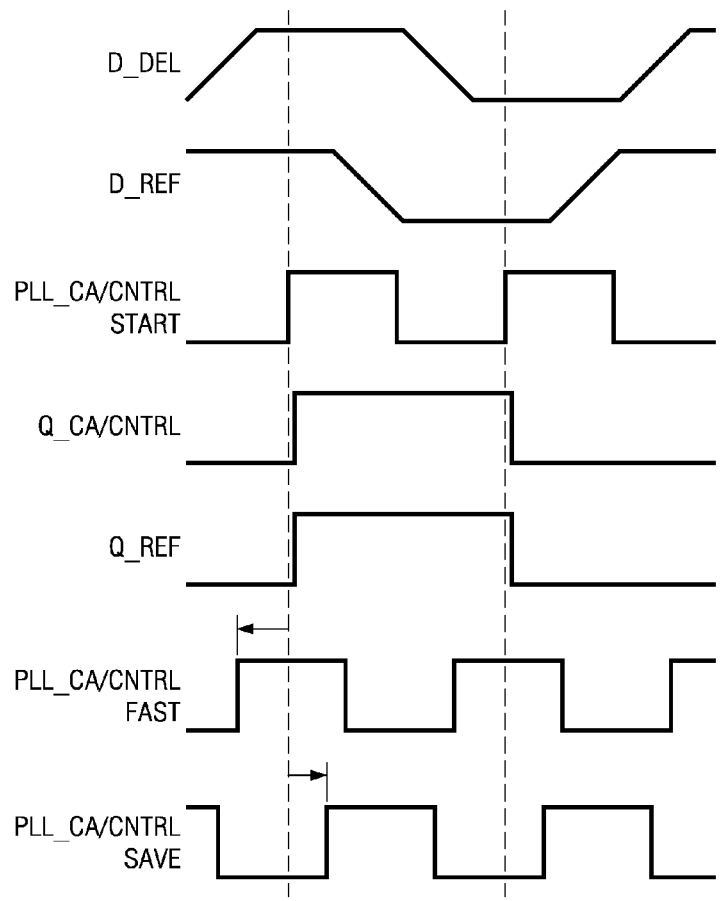
FIG. 2 is a signal diagram illustrating the operation of the data buffer.

FIG. 2 is a signal diagram illustrating the operation of the data buffer. The data input of FF2 receives a delayed version D_DEL of the input data CA/CNTRL (typically address data). FF3 receives data D_REF with minimum delay. During start-up or at a specific point of time during operation, the systems may switch to a learn cycle. During a learn cycle, a signal CLK_FF1 is divided by two and passed to the reference path and via multiplexer MUX to the data path. FF2 and FF3 are clocked by PLL_CA/CNTRL with a predetermined phase relationship to PLL_CLK. The respective output signals of FF2 and FF3 are shown as Q_REF and Q_CA/CNTRL in FIG. 2. During the learn routine, the control circuitry shifts the phase of clock signal PLL_CA/CNTRL and determines whether the output signals Q_REF or Q_CA/CNTRL of FF2 and FF3 have the same or different states for the respective different phases of the rising edge of the clock PLL_CA/CNTRL. FIG. 2 reflects only a situation where both output signals, Q_REF and Q_CA/CNTRL have equal states for an initial phase of the rising edge of the clock PLL_CA/CNTRL. However, shifting the rising edge will produce constellations, where the output signals Q_REF and Q_CA/CNTRL are different. The output signals Q_REF and Q_CA/CNTRL are passed to an XOR gate in order to determine, whether they have different or equal states. This allows the control circuitry to establish the delay based on the phase offset between the reference path and the delay path. Eventually, the phase of PLL_CA/CNTRL is adjusted with respect to the learning results. For high speed applications, the phase of PLL_CA/CNTRL may be set for minimum delay or for minimum setup time, which is illustrated by signal PLL_CA/CNTRL_fast. However, if a larger margin is needed, due to production spread or varying operation conditions, the phase may be set for a different optimum setup and/or hold timing as illustrated by PLL_CA/CNTRL save.

Figure 3:
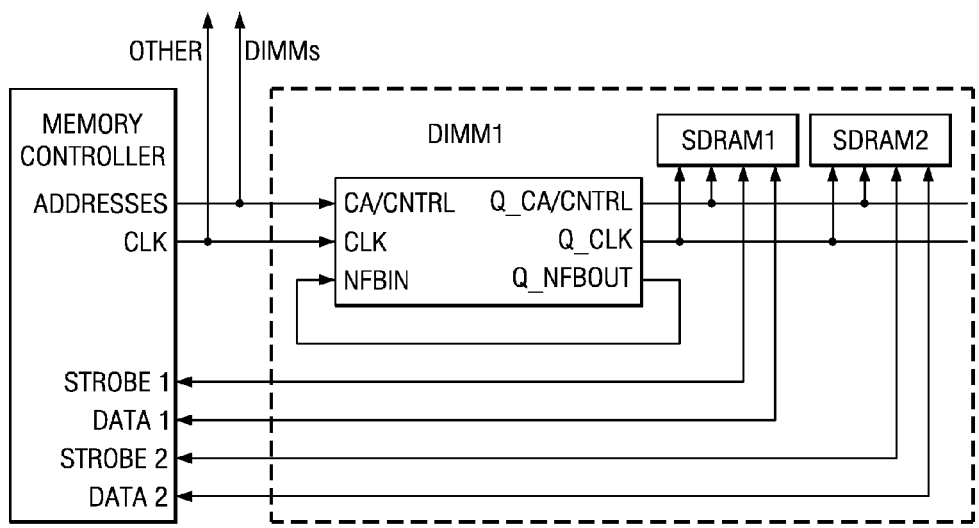
FIG. 3 is a schematic block diagram of a memory system in which the data buffer can be used.

The external output data Q_CA/CNTRL is intended to be supplied to a destination device along with the external output clock signal Q_CLK. By way of a preferred application, FIG. 3 shows a RAM memory system with a memory controller and a DIMM module which incorporates one of the inventive data buffers, referred to as "Registered Buffer", and a plurality of similar memory devices SDRAM1, SDRAM2, . . . , with the obvious option of adding further similar DIMM modules to the memory system. Although only one data path with input signal CA/CNTR and output signal Q_CA/CNTRL is shown, it should be clear that the signals would be n bits wide.

Those skilled in the art to which the invention relates will appreciate that the described embodiments are merely representative examples, and that there are other ways and variations of ways to implement the claimed invention.

What is claimed is:

1. A digital data buffer having at least one data path with a data input for receiving a digital data input signal, a clock input for receiving a clock input signal, and a data output providing a digital data output signal for application to a data destination device, the buffer further having a clock output for providing an output clock signal to the data destination device and a phase locked loop with a phase aligner, a clock input, a feedback input, a feedback output and a plurality of clock outputs;
wherein:
the data path has a first data register with a data input, a clock input and a data output;
the data path has a second data register with a data input, a clock input and a data output;
the data input of the first data register is selectively coupled to the data input of the buffer or to a reference data input through a multiplexer;
the data output of the first data register is coupled to the data input of the second data register;
the data output of the buffer is coupled to the data output of the second data register;
the clock input of the buffer is coupled to the clock input of the first data register (FF1),
the clock input of the buffer is coupled to the clock input of the phase locked loop;
a first clock output of the phase locked loop provides a feedback clock signal for application to the feedback input of the phase locked loop;
a reference data path is provided in parallel with the data path, including a third data register with a data input to which the reference data input is coupled, and an reference data output;
a second clock output of the phase locked loop provides a clock signal shifted in phase by the phase aligner with respect to the feedback clock signal for application to the clock input of the second data register and to the clock input of a third data register;
the data output of the second data register and the reference data output of the third data register are applied to inputs of a logic circuit that has a control output;
the phase aligner in the phase locked loop has associated control circuitry with a control input coupled to the control output of the logic circuit; and
a learn cycle control signal is applied in parallel to the multiplexer and to the control circuitry of the phase aligner, causing the phase aligner in a learn cycle to adjust the phase of the clock signal at the second clock output of the phase locked loop so as to optimize the setup/hold timing at the data input of the second data register.

2. The buffer of claim 1, wherein the reference data input is derived from the clock input by frequency division.

3. The buffer of claim 1, wherein the gate circuit comprises an XOR gate followed by a fourth data register clocked by the second clock output of the phase locked loop.

4. The buffer of claim 1, wherein the phase locked loop has a third clock output that provides a clock signal shifted in phase by the phase aligner with respect to the feedback clock signal for application to the data destination device.

5. The buffer of claim 1, wherein the learn cycle control signal is applied upon system power-on.

6. The buffer of claim 5, wherein the learn cycle control signal is applied repeatedly after system power-on.

7. A memory system, comprising a memory controller and at least one memory board; the memory board comprising a digital data buffer and a plurality of RAM modules; wherein digital address and clock signals from the memory controller are applied to each data path of the digital data buffer as digital data input signals and a clock input signals, and data output signals and clock output signals from the digital data buffer are applied in parallel to the RAM modules;
the buffer comprising at least one data path with a data input for receiving a digital data input signal, a clock input for receiving a clock input signal, and a data output providing a digital data output signal for application to a data destination device, the buffer further having a clock output for providing an output clock signal to the data destination device and a phase locked loop with a phase aligner, a clock input, a feedback input, a feedback output and a plurality of clock outputs;
wherein:
the data path has a first data register with a data input, a clock input and a data output;
the data path has a second data register with a data input, a clock input and a data output;
the data input of the first data register is selectively coupled to the data input of the buffer or to a reference data input through a multiplexer;
the data output of the first data register is coupled to the data input of the second data register;
the data output of the buffer is coupled to the data output of the second data register;
the clock input of the buffer is coupled to the clock input of the first data register (FF1),
the clock input of the buffer is coupled to the clock input of the phase locked loop;
a first clock output of the phase locked loop provides a feedback clock signal for application to the feedback input of the phase locked loop;
a reference data path is provided in parallel with the data path, including a third data register with a data input to which the reference data input is coupled, and an reference data output;
a second clock output of the phase locked loop provides a clock signal shifted in phase by the phase aligner with respect to the feedback clock signal for application to the clock input of the second data register and to the clock input of a third data register;
the data output of the second data register and the reference data output of the third data register are applied to inputs of a logic circuit that has a control output;
the phase aligner in the phase locked loop has associated control circuitry with a control input coupled to the control output of the logic circuit; and
a learn cycle control signal is applied in parallel to the multiplexer and to the control circuitry of the phase aligner, causing the phase aligner in a learn cycle to adjust the phase of the clock signal at the second clock output of the phase locked loop so as to optimize the setup/hold timing at the data input of the second data register.

* * * * *

UNITED STATES PATENT AND TRADEMARK OFFICE
CERTIFICATE OF CORRECTION

PATENT NO. : 7,800,975 B2  
APPLICATION NO. : 12/028637  
DATED : September 21, 2010  
INVENTOR(S) : Gerd Rombach and Sotirios Tambouris Page 1 of 1

It is certified that error appears in the above-identified patent and that said Letters Patent is hereby corrected as shown below:

Title Page, Item (75)

The name of Inventor No. 2 needs to be corrected:

"Sortitios Tambouris" to --Sotirios Tambouris.--

Signed and Sealed this
Twenty-second Day of February, 2011

David J. Kappos
*Director of the United States Patent and Trademark Office*